United States Patent [19]

Reche

[11] Patent Number: 5,282,922
[45] Date of Patent: Feb. 1, 1994

[54] HYBRID CIRCUIT STRUCTURES AND METHODS OF FABRICATION

[75] Inventor: John J. Reche, Ventura, Calif.

[73] Assignee: Polycon Corporation, Tempe, Ariz.

[21] Appl. No.: 850,382

[22] Filed: Mar. 11, 1992

Related U.S. Application Data

[63] Continuation of Ser. No. 739,255, Aug. 1, 1991, abandoned, which is a continuation of Ser. No. 437,982, Nov. 16, 1989, abandoned.

[51] Int. Cl.$^5$ .............................................. H01L 21/00
[52] U.S. Cl. .................................... 156/643; 437/190;
437/195; 437/228; 437/235; 148/DIG. 103;
148/DIG. 106
[58] Field of Search ................. 156/643; 437/195, 228,
437/235, 190; 148/DIG. 103, DIG. 106

[56] References Cited

U.S. PATENT DOCUMENTS

| | | | |
|---|---|---|---|
| 3,844,831 | 10/1974 | Cass et al. | 437/195 |
| 4,592,801 | 6/1986 | Hara et al. | 156/643 |
| 4,686,000 | 8/1987 | Heath | 156/643 |
| 4,731,318 | 3/1988 | Roche et al. | 437/200 |
| 4,767,724 | 8/1988 | Kim et al. | 156/656 |
| 4,789,648 | 12/1988 | Chow et al. | 437/228 |

Primary Examiner—Brian E. Hearn
Assistant Examiner—Laura M. Holtzman
Attorney, Agent, or Firm—Blakely, Sokoloff, Taylor & Zafman

[57] ABSTRACT

Hybrid circuit structures and methods of fabrication particularly suitable for the fabrication of high density multi-layer interconnects utilizing silicon substrates are disclosed. In accordance with the method, a layer of alumina is put down over the silicon substrate, typically having an oxide layer thereover, which layer of alumina acts as a blocking barrier to any subsequent plasma etching process for etching polymer layers thereover during the subsequent high density multilayer interconnect fabrication steps. Various representative high density multi-layer interconnect structures on silicon substrates and methods of forming the same are disclosed, including the inclusion of an adhesion enhancement layer over the layer of alumina to enhance the adhesion of a polymer which would not otherwise adhere well directly to the layer of alumina.

15 Claims, 1 Drawing Sheet

HYBRID CIRCUIT STRUCTURES AND METHODS OF FABRICATION

This application is a continuation of U.S. Ser. No. 739,255 filed on Aug. 1, 1991, now abandoned, which is a continuation of U.S. application Ser. No. 437,982 filed on Nov. 16, 1989, now abandoned.

BACKGROUND OF THE INVENTION

1. Field of the Invention

The present invention relates to the field of hybrid circuits, and more particularly to hybrid circuits for interconnecting unpackaged integrated circuits.

2. Prior Art.

Hybrid circuits of various forms are well-known in the prior art. Such circuits have been generally used for the high density packaging of active and passive devices, more recently integrated circuits, discreet components and the like in a high density configuration. The densities that normally have been obtainable in the more conventional hybrid circuits are much higher than obtainable with packaged devices using conventional integrated circuit technology.

More recently, surface mount technology (SMT) methods have been used to at least approach the density of packaging theretofore obtainable in the prior hybrid circuits. In accordance with SMT, integrated circuits, discreet components, arrays of components, etc., are packaged not in the usual dual-in-line packages with conventional leads, lead spacing, etc., but rather with a minimal sized protective coating with relatively tightly spaced connection pads on one surface thereof. These SMT devices are typically solder bonded to an appropriately laid out and tightly packed printed circuit board to result in the required circuit board area for a given circuit which is only a fraction of that obtainable with conventional dual-in-line (DIP) packaging and printed circuit board layout techniques. Further, automatic SMT device mounting equipment and bonding equipment keeps the cost of SMT circuits down, particularly in high quantities, making this technology applicable even to consumer products. Also, in very recent years, there has been a considerable effort to develop larger and larger scale integrated circuits, with an ultimate goal of achieving wafer scale integration. While progress has been made in this direction, particularly with respect to microprocessor and microcomputer chip sets, the progress in other areas has been disappointingly slow to many people for various reasons. Smaller and smaller device sizes and line widths in integrated circuits have allowed substantial increases in integrated circuit complexity without requiring an equal increase in chip area. Further, except for microprocessor chip sets and memory devices wherein more is always better, it has been difficult to identify standardized functions for LSI and larger integrated circuits which will have a sufficient market volume to justify the same.

In addition to the foregoing, very large scale and larger integrated circuits generally have a bad yield problem which may only be overcome, at least in part, by providing on chip redundancy. In particular, a common approach to the yield problem is to provide redundancy for each functional part of the circuit, thereby increasing the required chip area by approximately 100 percent. While such redundancy can dramatically increase the yields by now requiring only one out of two of each functional block circuits to operate, rather than one out of one which would be required without redundancy, the effect of the redundancy is not only to increase chip size, but also to cause relatively long interconnects which substantially slow down the circuit because of the resulting relatively high parasitic capacitance.

As a result, considerable interest has developed in forming multi-chip modules wherein a plurality of integrated circuits in chip form are mounted on a substrate and interconnected to provide the functions of Ultra Large Scale Integration (USLI) and higher integration without the normally associated problems thereof. Such interconnecting devices, sometimes referred to as high density multi-layer interconnects (HDMI), allow the testing of individual integrated circuits before mounting, thereby eliminating the need for redundancy for suitable yields. This can allow closer connection of the functional blocks on the HDMI than could be achieved in a corresponding single chip device. It also results in a faster circuit by reducing parasitic capacitance, can eliminate the need for on-chip line drivers sometimes required because of the long interconnect lines on large single chip integrated circuits. It reduces costs by allowing testing of the integrated circuit functional blocks and the elimination of only the bad ones before using the same in the HDMI, and of course allows one to obtain the advantages of wafer scale integration without the attendant problems thereof even in applications wherein the market volume for the product is too small to consider larger scale or wafer scale integration.

At the present time, HDMI technology is somewhat of a mix, in some ways resembling integrated circuit fabrication techniques and in other ways somewhat resembling printed circuit board techniques. By way of example, conductor line widths are beginning to approach those used in at least older integrated circuit designs, and bonding techniques used to interconnect the chips to the HDMI are those typically used in conventional integrated circuit packaging. On the other hand, the materials used for the insulative layers, typically polymers, and the number of cross-overs required are more similar to that found in printed circuit board fabrication, as opposed to the silicon-oxide layer and the deposited metal interconnect layer of typical integrated circuits.

In the fabrication of HDMIs, various materials may be used for the substrate, including metals, semi-conductors and insulators, each having various advantages and disadvantages for such use. One material of particular interest is silicon, as it obviously has the same thermal expansion as the silicon integrated circuit to be mounted thereon, has reasonable heat transfer capabilities, reasonable cost and is readily processed by techniques readily available and well understood in the industry. On the other hand, the fabrication of an HDMI differs from integrated circuit fabrication in that, as stated before, the various insulative layers in the high density multi-chip interconnect are generally polymer layers not oxide layers. Consequently, the same are not readily etchable by common liquid etchants, but rather must be etched by a fluorine ion bearing plasma etching process, which process will rapidly etch silicon and silicon oxides. Consequently, in the prior methods of fabricating HDMI's using a silicon substrate, great care must be taken when etching through the first polymer layer on the substrate, as the etching must be terminated at the proper time to remove the desired local regions of the first layer of polymer without creating deep crevices in the substrate itself. Obviously this becomes a matter of both control and compromise, as too little etching will not remove all of the first layer of insulator in the regions desired, and too much etching will allow deep crevices to be formed in the substrate. Thus, in the prior art, some significant etching of a substrate is normally encountered, and tolerated to ensure the desired insulator removal is achieved. The purpose of the present invention is to avoid this problem, making the processing during the HDMI fabrication much more tolerant, and avoiding the pitting of the substrate as experienced in the prior art.

BRIEF SUMMARY OF THE INVENTION

Hybrid circuit structures and methods of fabrication particularly suitable for the fabrication of high density multi-layer interconnects utilizing silicon substrates are disclosed. In accordance with the method, a layer of aluminium oxide is put down over the silicon substrate, typically having an oxide layer thereover, which layer of alumina acts as a blocking barrier to any subsequent plasma etching process for etching polymer layers thereover during the subsequent high density multilayer interconnect fabrication steps. Various representative high density multi-layer interconnect structures on silicon substrates and methods of forming the same are disclosed, including the inclusion of an adhesion enhancement layer over the layer of alumina to enhance the adhesion of a polymer which would not otherwise adhere well directly to the layer of alumina.

DETAILED DESCRIPTION OF THE INVENTION

Figure 1:
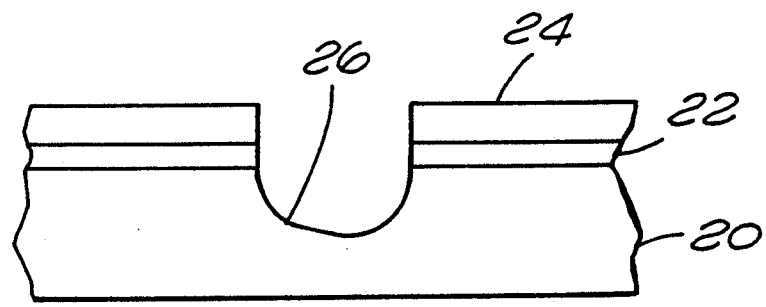
FIG. 1 is a cross-section illustrating the etching of a silicon substrate commonly encountered during the plasma etching of a polymer layer thereon.

First referring to FIG. 1, a schematic cross-section of a portion of a silicon substrate illustrating the problem encountered with prior art fabrication techniques for HDMIs may be seen. As shown in the figure, silicon substrates 20 having a silicon-oxide layer 22 thereon are appropriate substrates for use in the fabrication of HDMIs. Additional steps in the fabrication process include putting down a thick layer of polymer 24. Thereafter a metalization layer is put down over the polymer layer 24 and patterned, and one or more additional sets of thick polymer and patterned metalization layers are formed thereover. At some point or points in the process, it is common to locally etch through the polymer layer 24 to expose a local region of a substrate. Since the typical polymers are relatively insensitive to the normal liquid etchants used for patterning metalized layers, etching of the polymer normally is accomplished with the use of a fluorine ion bearing plasma etching process. Such an etching process, while etching the polymer, will also etch the oxide layer 22 and the silicon itself at a relatively high rate. Consequently, in order to achieve the complete removal of the polymer regions desired, some slight over etch will normally be required, resulting in a substantial pit or crevice 26 being formed in the silicon substrate. Such pitting of course is undesired, as it disturbs the planar characteristic of a structure, makes the formation of any structure within the opening or pitted region much more difficult and of course will result in a very thick local polymer layer in any subsequent application of polymer in the later fabrication processing. It can also offer result in short circuits after deposition and etching of the subsequent metalization layer because of the crevice created in the semiconductive material, as metal is difficult to remove completely from the trench.

Figure 2:
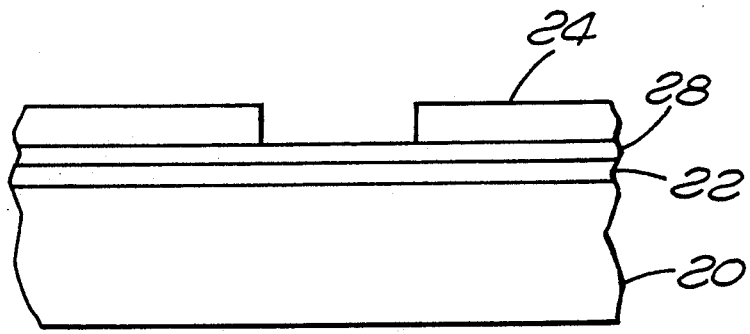
FIG. 2 is a schematic diagram illustrating the blocking effect the present invention layer of alumina over the substrate has on the typical fluorine ion plasma etch used to etch polymer layers thereover.
Figure 3:
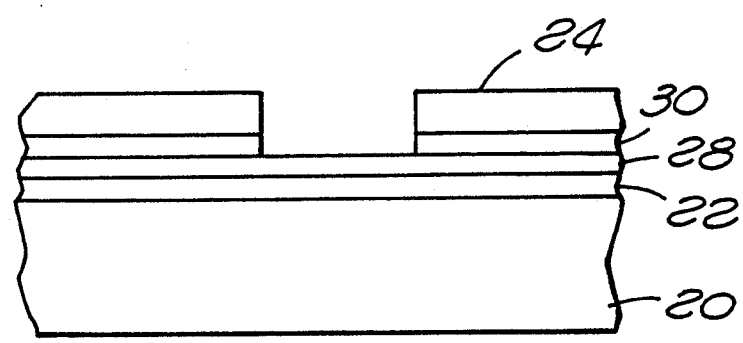
FIG. 3 is a schematic diagram similar to FIG. 2, though further illustrating the inclusion of an adhesion enhancement layer, preferably a silicon-oxide layer, over the layer of alumina.

Now referring to FIG. 2, a cross-section illustrating the basic structure and method of the present invention may be seen. As in FIG. 1, the substrate 20 is a silicon substrate having a layer of silicon-oxide 22 thereon. In accordance with the present invention however, a layer of alumina 28 is put down over the silicon-oxide. The alumina provides a mask or barrier for the fluorine ion bearing plasma etch so that in any subsequent etching processes etching windows in the first polymer layer 24, the etching process will be stopped by the alumina so that neither the silicon-oxide layer 22 on the substrate nor the silicon substrate 20 itself will be disturbed by the etching process. The layer of alumina may be put down by sputtering the same onto the oxide layer, or alternatively, may be formed by putting down a layer of aluminum and oxidizing the same in an oxidizing environment as desired. In either event however, the resulting layer of alumina will stop the plasma etching process, protecting the silicon-oxide and the silicon therebelow. For this purpose it is preferred to use a layer of alumina of approximately 2000 Angstroms in thickness to assure the desired integrity of the layer for blocking purposes, though a layer in the range of approximately 500 to 10,000 Angstroms is suitable Depending upon the polymer used for polymer layer 24, it is possible that the adhesive between the polymer layer 24 and the alumina layer 28 will not be adequate. By way of example, the adhesion of a benzocyclobutene to the layer of alumina is inadequate to provide a useful and reliable HDMI. Consequently, in such situations in accordance with the present invention, an additional layer is put down which additional layer is selected to provide adhesion by to the aluminum on one side thereof, and to the polymer on the other side thereof. This is illustrated in FIG. 3 wherein the silicon substrate 20 with the silicon-oxide layer 22 and the alumina layer 28 thereon also includes a silicon-oxide layer 30 on the alumina for adhesion purposes. As shown in the Figure, the silicon-oxide layer 28, being subject to rapid etching of the plasma etch, will be etched thereby during the etching of the polymer layer 24, though the integrity of the oxide layer for adhesion purposes under the remaining polymer layer 24 will be unaffected by the etching process, thereby achieving the desired adhesion enhancement.

Figure 4:
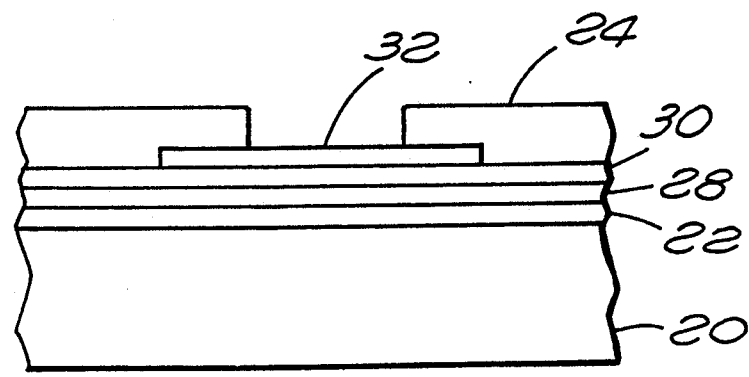
FIG. 4 is a schematic diagram similar to FIGS. 2 and 3, though further illustrating a patterned ground plane as part of the structure illustrated in the cross-section thereof.

Structures of the present invention of course may take various forms. By way of example, when using semiconductive and insulative substrates, it is common to provide a conductive ground plane over the substrate before forming the various layers of polymer and metalized interconnect thereover. Such ground planes may be continuous ground planes over the substrate, or alternatively, patterned ground planes as desired. The present invention of course is readily applicable to these structures as well. By way of example, as shown in FIG. 4, a silicon substrate 20 with an oxide layer 22 thereover is processed first by providing a layer of alumina 28 over the oxide layer 22. Then, the optional additional layer for adhesion enhancement 30 is provided. Thereafter, preferably a patterned ground plane layer of metal 32 is provided. Typically at some point in the processing a window is opened through the polymer layer 24 to expose the ground plane layer 32 to provide contacts thereto, other areas of the polymer layer 24 also being opened (not shown) by the plasma etch process, which process is stopped as explained before, by the layer of alumina 28. This structure as well as that shown in FIG. 2 and 3 are of course exemplary only of the various ways the present invention may be utilized, the various figures being schematic only and illustrating exemplary structures only up to the first relatively thick layer of polymer, even though, depending upon the specific fabrication process used, a patterned metalization layer as well as additional layers of polymer and patterned metalization may be built up thereover before any windows in the layer 24 are opened, or alternatively, windows in layer 24 may be opened at various stages in the processing.

Also, while alumina (aluminum oxide) is the preferred material for use for the present invention, other materials may be used for the protection of the substrate, provided such materials have the desired properties. The desired properties include chemical resistance to fluorine ions (F ions) in weak liquid solutions, e.g. a dilute (typically approximately 2%) aqueous solution of HF, or ions in a plasma. While aluminum oxide is impervious to both when properly sputtered, so is hafnium oxide and tungsten trioxide. Other desired characteristics of such materials include being a good electrical insulator, and having good adhesion to the substrate and good adhesion to the subsequent polymer layer to be deposited thereon. The materials may be deposited by sputtering deposition, ion beam or any other vacuum deposition technique, as well as by other techniques. By way of example, the material may be formed from sol-gels or other organic-metallic (or metallic-organic) materials. Such compounds consist of organic molecules bonded to metal molecules (organic-metallics, sometimes referred to as metallic-organics). By heating the compound the bonds between the organic and metallic parts may be broken to form carbon compound gases, leaving the metal behind. Heating the organic-metallic in a oxidizing atmosphere results in metallic oxides being formed and left behind. Thus, using this technique, oxides similar to the ones mentioned for vacuum deposition, namely aluminum oxide, hafnium oxide and tungsten trioxide may be formed. Thus, while the present invention has been disclosed and described with respect to preferred embodiments thereof, it will be understood that the methods and structures of the present invention may be varied without departing from the spirit and scope thereof.

I claim:

1. A method of patterning a polymer layer over a silicon substrate comprising the steps of;
    (a) providing a layer of material resistant to fluorine ion bearing plasma over an entire first surface of the silicon substrate;
    (b) applying a conductive layer over at least a portion of said resistant material wherein said conductive layer is entirely separated from the silicon substrate by said resistant material;
    (c) applying a polymer layer to said resistant material wherein said polymer layer is entirely separated from the silicon substrate by said resistant material; and,
    (d) etching a portion of said polymer layer with a fluorine ion bearing plasma, wherein said resistant material prevents said fluorine ion bearing plasma from etching the silicon substrate.

2. The method of of claim 1 wherein the layer provided over the first surface of the silicon substrate in step (a) is a layer of material selected from the group consisting of aluminum oxide, hafnium oxide and tungsten tri-oxide.

3. The method of of claim 1 wherein the layer provided over the first surface of the silicon substrate in step (a) is provided by sputtering.

4. The method of of claim 1 wherein the layer provided over the first surface of the silicon substrate in step (a) is provided by ion beam deposition.

5. The method of claim 1 wherein the layer provided over the first surface of the silicon substrate in step (a) is provided by heating a sol-gel or organo-metallic in an oxidizing atmosphere.

6. The method of of claim 1 wherein the layer provided over the first surface of the silicon substrate in step (a) is provided by depositing a layer of aluminum over the silicon substrate and oxidizing the same.

7. The method of of claim 1 wherein the layer provided over the first surface of the silicon substrate in step (a) is provided by sputtering a layer of alumina onto the silicon substrate.

8. The method of of any of claims 1, 2, 3, 4, 5, 6 or 7 wherein said conductive layer is a conductive ground plate.

9. The method of of claim 1 further comprising the step of patterning the conductive layer.

10. The method of of claims 1, 2, 3, 4, 5, 6 or 7 further comprising the step of providing an adhesion layer over the layer formed in step (a) prior to forming the conductive layer.

11. The method of of claim 10 wherein the adhesion layer is a layer of silicon oxide.

12. A method of patterning a polymer layer over a silicon substrate comprising the steps of;
    (a) sputtering a layer of alumina over an entire first surface of the silicon substrate;
    (b) applying a conductive layer over a portion of said layer of alumina;
    (c) applying a polymer layer over said conductive layer and said layer of alumina wherein said conductive and polymer layers are entirely separated from the silicon substrate by said layer of alumina; and
    (d) etching a portion of said polymer layer with a fluorine ion bearing plasma, wherein said layer of alumina prevents said fluorine ion bearing plasma from etching the silicon substrate.

13. The method of of claim 12 further comprising the step of patterning the conductive layer.

14. The method of of claims 12 or 13 further comprising the step of providing an adhesion layer over the layer of alumina formed in step (a) prior to forming the conductive layer in step (b).

15. The method of fabricating a high density multichip interconnect of claim 14 wherein the adhesion layer is a layer of silicon oxide.

* * * * *